United States Patent
Ito et al.

(10) Patent No.: US 6,448,139 B2
(45) Date of Patent: Sep. 10, 2002

(54) MANUFACTURING METHOD OF SEMICONDUCTOR DEVICE

(75) Inventors: Hiroyasu Ito, Nagoya; Takafumi Arakawa, Kariya; Masatoshi Kato, Aichi-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/875,026

(22) Filed: Jun. 7, 2001

(30) Foreign Application Priority Data

Jun. 9, 2000 (JP) ............................... 2000-173796

(51) Int. Cl.$^7$ ........................................... H01L 21/336
(52) U.S. Cl. ................................................. 438/270
(58) Field of Search ........................................ 438/270

(56) References Cited

U.S. PATENT DOCUMENTS

| | | | |
|---|---|---|---|
| 5,434,447 A | | 7/1995 | Miyashita et al. |
| 5,561,073 A | * | 10/1996 | Jerome et al. ............... 438/404 |
| 5,783,491 A | | 7/1998 | Nakamura et al. |
| 5,869,387 A | | 2/1999 | Sato et al. |
| 6,037,238 A | * | 3/2000 | Chang et al. ................ 438/426 |
| 6,100,162 A | * | 8/2000 | Doan et al. .................. 438/433 |
| 6,121,117 A | | 9/2000 | Sato et al. |
| 6,228,727 B1 | * | 5/2001 | Lim et al. ................... 438/296 |

FOREIGN PATENT DOCUMENTS

| | | | | |
|---|---|---|---|---|
| DE | 010029036 C1 | * | 8/2001 | ....... H01L/21/8242 |
| JP | 52149479 | * | 12/1977 | ......... H01L/21/302 |
| JP | 56033845 | * | 4/1981 | ........... H01L/21/31 |
| JP | 63-313834 | | 12/1988 | |
| JP | 1-107554 | | 4/1989 | |
| JP | 404089315 | * | 3/1990 | ......... H01L/21/306 |
| JP | 04243149 | * | 8/1992 | ........... H01L/21/66 |
| JP | 5-21595 | | 1/1993 | |
| JP | 9-45762 | | 2/1997 | |
| JP | 9-260663 | | 10/1997 | |

OTHER PUBLICATIONS

Stanley Wolf Silicon Processing for the VSLI Era vol. 2 Lattice Press p. 55.*
U.S. patent application Ser. No. 09/630,786, Ishikawa, filed Aug. 2, 2000.
U.S. patent application Ser. No. 09/758,377, Aoki et al., filed Jan. 12, 2001.
U.S. patent application Ser. No. 09/790,888, Soga et al., filed Feb. 23, 2001.
U.S. patent application Ser. No. 09/852,690, Ito et al., filed May 11, 2001.

* cited by examiner

Primary Examiner—Olik Chaudhuri
Assistant Examiner—David S Blum
(74) Attorney, Agent, or Firm—Law Offices of David G. Posz

(57) ABSTRACT

A semiconductor substrate has a trench for forming a gate insulation film and a gate electrode therein, or an insulated isolation isolating a semiconductor element like a transistor from other elements. The trench is formed by anisotropic dry etching. After that, a shape of the trench is improved so that a bottom portion and an opening portion are rounded or tapered by a wet process using a mixed solution containing hydrofluoric acid and nitric acid. By modifying the shape of the trench, electrical characteristics of the trench are improved. For example, an oxide film formed in the trench has high quality, whereby a gate withstanding voltage is improved.

29 Claims, 10 Drawing Sheets

MANUFACTURING METHOD OF SEMICONDUCTOR DEVICE

CROSS REFERENCE TO RELATED APPLICATION

This application is based upon Japanese Patent Application No. 2000-173796 filed on Jun. 9, 2000, the contents of which are incorporated herein by reference.

BACKGROUND OF THE INVENTION

1. Field of the Invention

The present invention relates to a manufacturing method of a semiconductor device having a trench, and more particularly of a semiconductor device having a buried gate.

2. Related Arts

Recently, a semiconductor device with an electrical isolation (trench isolation) structure or a semiconductor device with an embedded gate (trench type gate) has been proposed in accordance with improved integration degrees of various semiconductor devices.

A semiconductor device with a trench is formed by a method shown in FIGS. 13A to 13E as one method of prior art.

Figure 13A:
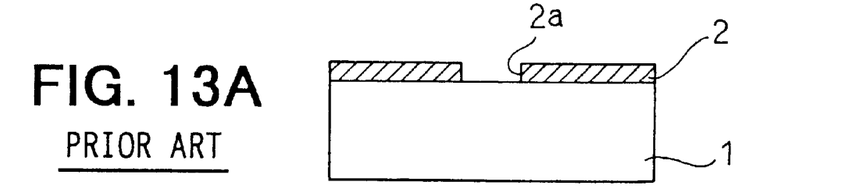
FIGS. 13A to 13E are schematic cross sectional views of a semiconductor substrate having a trench showing manufacturing steps of a prior art.
Figure 13B:
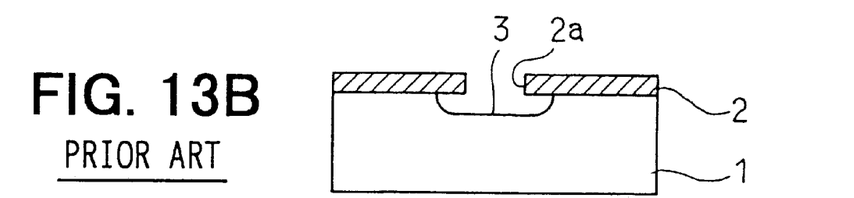
Figure 13C:
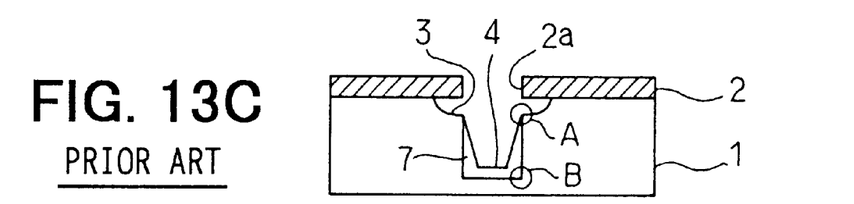
Figure 13D:
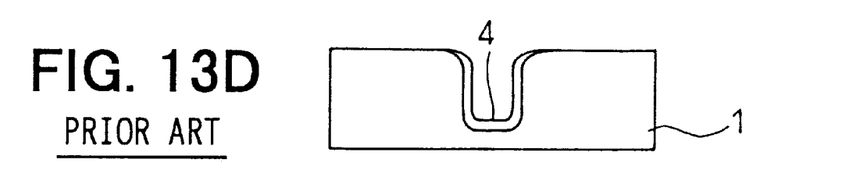

First, an opening portion 2a is formed in a mask member 2 for forming a trench by patterning the mask member 2 formed on a silicon substrate 1 as shown in FIG. 13A. Then, a concavity portion 3 having a bowl shape is formed at a portion where a trench opening portion is to be formed by isotropic etching as shown in FIG. 13B. After that, a trench 4 is formed in the silicon substrate 1 by anisotropic etching as shown in FIG. 13C.

Figure 13E:
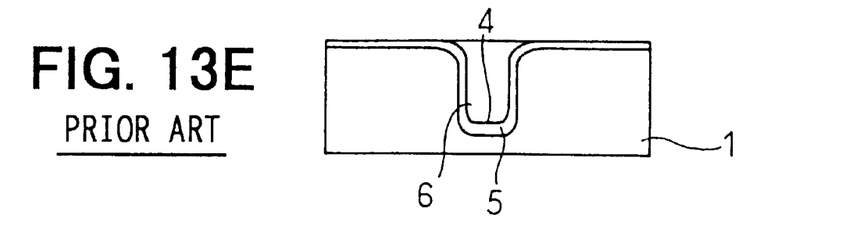

Subsequently, formation of a sacrificial oxide film, removal of the sacrificial oxide film, and removal of the mask member 2 (see FIG. 13D) are performed successively. After that, an insulation film 5 is formed in the trench 6 as shown in FIG. 13C. Then, the trench 4 is filled with polycrystalline silicon 6, and a part of the polycrystalline silicon 4 disposed outside of the trench 4 is removed as shown in FIG. 13E.

According to this method, an angle at an opening portion of the trench 4 is prevented from becoming about 90° because a shape of the opening portion of the trench 4 is improved by the isotropic etching. However, as shown in FIG. 13C, a portion A contacting a side face of the trench 4 becomes a sharp edge because of the shape of the concavity portion 3, or a portion B disposed at a corner of the trench 4 becomes a sharp edge.

Shapes of these portions A and B are not easily improved after a thermal oxidation step is conducted. When the sharp edge of the portion A or B remains, insulation characteristics of the insulation film 5 formed in the trench 4 is deteriorated since the portion A or B becomes a concentrating point of electric field.

Moreover, thermal treatment is conducted while an etching damage layer 7 remains (see FIG. 13C), whereby a defect layer is easily formed on an inner surface of the trench 4. Therefore, the insulation characteristics of the insulation film 5 formed in the trench 4 may be deteriorated in a case that the insulation film 5 is formed by oxidizing the remaining damage layer 7 or the defect layer.

Figure 14A:
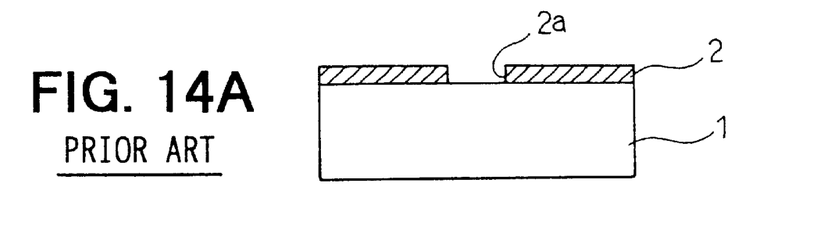
FIGS. 14A to 14E are schematic cross sectional views of a semiconductor substrate having a trench showing manufacturing steps of another prior art.
Figure 14B:
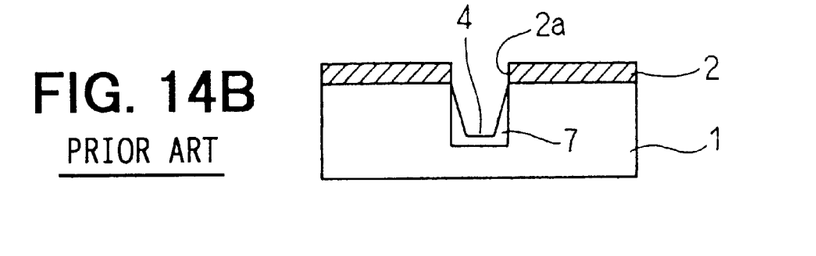

Another method is shown in FIGS. 14A to 14E. An opening portion 2a is formed in a mask member 2 as shown in FIG. 14A. Then, a trench 4 is formed in a silicon substrate 1 by anisotropic etching as shown in FIG. 14B.

Figure 14C:
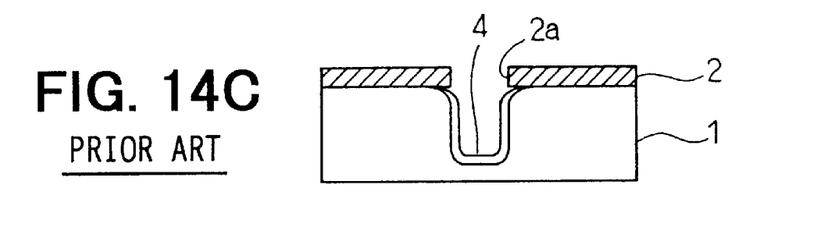
Figure 14D:
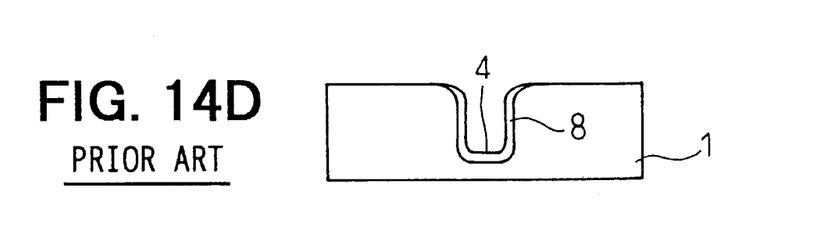
Figure 14E:
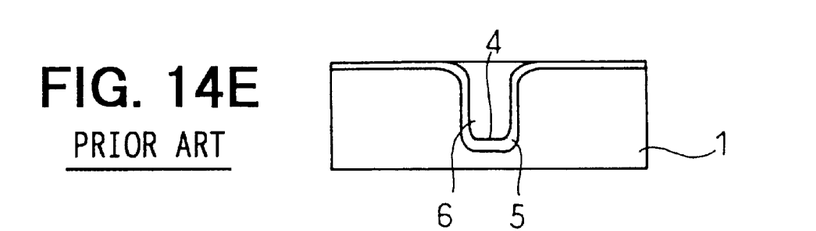

Subsequently, a shape at an opening portion of the trench 4 and a shape at a bottom portion of the trench 4 are improved by CDE (Chemical Dry Etching) treatment simultaneously as shown in FIG. 14C. After that, formation of a sacrificial oxide film, removal of the sacrificial oxide film, and removal of the mask member 2 (see FIG. 14 D) are performed successively. Then, after an insulation film 5 is formed in the trench 4, the trench 4 is filled with a polycrystalline silicon 6 as shown in FIG. 14E.

According to this method, formation of the portions A and B each having a sharp edge due to the shape of the concavity portion 3 shown in FIG. 13C and the concentration of electric field caused by the portions A and B are restrained.

However, since etching by the CDE treatment is isotropic dry etching, etching amount of the silicon in the trench 4 becomes large to round the opening portion and the bottom portion of the trench 4 sufficiently. As a result, a shape of the trench 4 fluctuates greatly. In addition, a polymer 8 composed of Teflon is formed and remains in the trench by the CDE treatment. The polymer 8 also deteriorates the insulation characteristics of the insulation film 5.

On the other hand, when the etching amount of the silicon is small, the shape of the trench 4 is not improved sufficiently, and the damage layer 7 remains in the trench 4, which deteriorates the insulation characteristics of the insulation film 5 as described above.

SUMMARY OF THE INVENTION

The present invention is devised to solve the above problems, and has an object to provide a manufacturing method of a semiconductor device having a trench in which an insulation layer with a high withstanding voltage characteristics and high quality can be formed.

According to a first aspect of the invention, after a trench is formed in a semiconductor substrate by anisotropic etching, a wet process is performed so that the semiconductor substrate is etched by a mixed solution containing hydrofluoric acid and nitric acid, whereby a shape of the trench is improved and a damage layer remaining in the trench is removed. Thus, an insulation layer, a semiconductor layer or the like is formed on a surface of the trench, which is suitable for forming the layer of the insulation film, the semiconductor film or the like. Therefore, quality of the layer of the insulation film, the semiconductor film or the like becomes fine, whereby a semiconductor device can have good electrical characteristics.

According to a second aspect of the invention, a high impurity concentration region is formed in a surface region of the semiconductor substrate. The wet process depends on a concentration of impurities in the semiconductor substrate. Therefore, an etching rate at the surface region of the semiconductor substrate is higher than that at a deep portion of the semiconductor substrate in the trench deeper than the surface region. Thus, a shape at an opening portion of the trench is modified from a right-angled shape after the anisotropic etching is performed into a rounded shape.

According to a third aspect of the invention, after the trench is formed in the substrate by the anisotropic etching, short-time heat treatment is performed, whereby crystallinity of the trench is improved. That is, the crystallinnity of the trench is restored.

According to a fourth aspect of the invention, after the wet process is performed, short-time heat treatment is conducted successively, whereby crystallinity of an inner surface of the trench is improved.

According to a fifth aspect of the invention, a semiconductor device having good electrical characteristics is achieved by a manufacturing method described below.

Namely, a trench is formed in a semiconductor substrate in a depth direction thereof through a mask member, which is formed on the semiconductor substrate, having an opening portion. Then, a polymer, generated in forming the trench, remaining in the trench is removed. Next, a wet process is performed so that the semiconductor substrate is etched by a mixed solution containing hydrofluoric acid and nitric acid. Thus, taper portions are formed on an opening portion and a bottom portion of the trench simultaneously by one feature inhering in the mixed solution that an etching rate depends on a face orientation of the semiconductor substrate, i.e., by a face orientation dependency of the etching rate.

Moreover, a damaged layer formed in the trench by the anisotropic etching for forming the trench, which may deteriorate quality of an insulation layer to be formed in the trench, can be removed by the other feature inhering in the mixed solution that an etching rate of the damaged layer in a semiconductor is different from that of a non-damaged layer in the semiconductor, i.e., by etching selectivity in the semiconductor.

Then, after a thermal oxidation film is formed in the trench as a sacrificial oxide film by thermal oxidizing treatment, the sacrificial oxide film is removed, whereby shapes at the opening portion and the bottom portion of the trench are rounded. Subsequently, the mask member is removed, an insulation film is formed in the trench, and then, the trench is filled with a polycrystalline silicon.

The trench formed through the steps described above can be applied to a trench for insulated isolating member that is formed around an element forming region to isolate the element from other elements, or applied to a trench for a trench gate type MOSFET or IGBT in which the insulation film is used as a gate insulation film, and the polycrystalline silicon is used as a gate electrode.

According to a sixth aspect of the invention, a semiconductor device having good electrical characteristics is achieved by a manufacturing method described below.

A trench is formed in a semiconductor substrate in a depth direction thereof through a mask member, formed on the semiconductor substrate, having an opening portion. Then, a polymer, generated in forming the trench, remaining in the trench is removed.

Then, short-time heat treatment is conducted successively, whereby crystallinity of an inner surface of the trench is improved. Therefore, it is preferable to apply the trench formed by the method described above to a trench for insulated isolating member that is formed around an element forming region to isolate the element from other elements, or to a trench gate type MOSFET or IGBT in which an insulation film formed on an inner surface of the trench is used as a gate insulation film, and a polycrystalline silicon filling the trench is used as a gate electrode.

According to a seventh aspect of the invention, a first conductive type layer is formed on one surface of a semiconductor substrate. A second conductive type region is formed in the first conductive type layer, and a first conductive type region is formed in the second conductive type region.

Therefore, when the method as described in the fifth aspect of the present invention is applied to this substrate, in addition to the effects by the two features of the mixed solution described above, an etching rate is varied in accordance with an impurity concentration profile of the first conductive type layer exposed in the trench by another feature inhering in the mixed solution that an etching ratio depends on an impurity concentration of the semiconductor substrate, i.e., by impurity concentration dependency of the etching rate, so that the shape of the opening portion of the trench is tapered so as to form a convexity. Moreover, the damaged layer in the trench is removed, and the inner surface of the trench is smoothed.

According to an eighth aspect of the invention, a first conductive type layer is formed on one surface of a semiconductor substrate. A second conductive type region is formed in the first conductive type layer, and a first conductive type region is formed in the second conductive type region.

Then, a trench is formed in a semiconductor substrate in a depth direction thereof through a mask member, formed on the semiconductor substrate, having an opening portion. Then, a polymer, generated in forming the trench, remaining in the trench is removed.

Next, short-time heat treatment is conducted, whereby crystallinity of an inner surface of the trench is improved. Therefore, it is preferable to apply the trench formed by the method described above to a trench for insulated isolating member that is formed around an element forming region to isolate the element from other elements, or to a trench gate type MOSFET or IGBT in which an insulation film formed on an inner surface of the trench is used as a gate insulation film, and a polycrystalline silicon filling the trench is used as a gate electrode.

According to a ninth aspect of the present invention, in the method described in the fifth aspect of the present invention, it is preferable that short-time heat treatment is performed before the thermal oxidizing treatment for forming the thermal oxidation film since crystallinity of an inner surface of the trench is improved (restored).

It is preferable in the method described in the first aspect of the present invention that the opening portion of the trench has a long shape (a rectangular shape) since the face orientation dependency of the etching ratio as the one of features inhering in the mixed solution described above works sufficiently, so that the taper portions are formed in the opening portion and the bottom portion of the trench preferably.

It is preferable that a volume ratio of the hydrofluoric acid in the mixed solution with respect to the nitric acid is set to a range 1:50 to 1:300 to effectively obtain the effects caused by the features of the mixed solution described above.

It is preferable that the mixed solution is diluted with pure water to obtain the effects obtained by the mixed solution described above while reducing an amount of the nitric acid.

It is preferable that the mask member and the thermal oxidation film are removed simultaneously.

It is preferable that the thermal oxidizing treatment for forming the thermal oxidation film is performed at 1100° C. Thus, the thermal oxidation film is formed so that the shape of the trench is modified to have a rounded shape effectively.

It is preferable that the thermal oxidizing treatment for forming the thermal oxidation film is performed after the mask member is removed.

It is preferable that the thermal oxidizing treatment for forming the thermal oxidation film is performed at 900° C. in atmosphere containing water vapor.

It is preferable that the insulation film formed on the inner surface of the trench is composed of a laminated layer containing a silicon oxide film and a silicon nitride film to improve electric characteristics thereof.

It is preferable that the silicon oxide film composing the insulation film includes a laminated silicon oxide film composed of a silicon oxide film formed by low-pressure CVD using TEOS (Tetra Ethyl Ortho-Silicate) as a raw material and a thermal oxidation film formed by thermal oxidation, so that a thickness of the oxide film is uniformed throughout by the CVD silicon oxide film, and an interface of the oxide film is improved by the thermal oxidation film.

It is preferable that the silicon oxide film composing the insulation film is formed by a step in which a silicon oxide film is formed by CVD method, and then, this CVD oxide film is thermally oxidized to densify and to make an interface between the silicon oxide film and a semiconductor fine.

It is preferable that the silicon nitride film composing the insulation film is formed by low-pressure CVD to densify, so that insulating capacity of the insulation layer is improved.

It is preferable that the first conductive type region is formed by implanting arsenic ions into the second conductive type region at $8 \times 10^{14}/cm^2$ or less, so that quality in a insulating layer formed on the first conductive type region is preventing from deteriorating.

It is preferable that the short-time heat treatment is performed at 800° C. or more in an atmosphere of hydrogen, so that the crystallinity of a semiconductor exposing on the trench is improved.

It is preferable that the short-time heat treatment is performed under reduced pressure, so that the crystallinity of a semiconductor exposing on the trench is improved, whereby quality of the insulation layer is improved.

It is preferable that the semiconductor substrate has a (110) face orientation, a variation of which is in a range of ±3°, and the trench is formed so that an extending direction of the trench is in a range ±3° with respect to a (100) face.

It is preferable that when the surface of the semiconductor substrate is inclined with respect to the (110) face, a long side of the trench formed by anisotropic etching is in parallel with an inclined direction being in parallel with the surface and being perpendicular to a non-inclined direction parallel with respect to the surface of the semiconductor substrate and the (110) face. Accordingly, in the trench, oxide films formed on a bottom, a corner in the vicinity of the bottom, and the opening portion are formed thicker than that formed on a sidewall of the trench. Namely, thickness of the oxide films formed on a corner at the opening portion and the corner peripheral of the bottom of the trench is prevented from being formed to be thin. In addition, dry oxidizing treatment is better to form thick oxide films on the corner at the opening portion and the corner peripheral of the bottom of the trench.

Other objects and features of the present invention will become more readily apparent from a better understanding of the preferred embodiment described below with reference to the following drawings.

DETAILED DESCRIPTION OF THE PREFERRED EMBODIMENTS

Specific embodiments of the present invention will now be described hereinafter with reference to the accompanying drawings in which the same or similar component parts are designated by the same or similar reference numerals.

(First Embodiment)

Referring to FIG. 1A to FIG. 8, a semiconductor substrate formed through a manufacturing method of a first embodiment will be described. A semiconductor device 11 shown in FIG. 1F as a schematic cross sectional view may be applied to, for example, a MOSFET having a buried trench (a trench gate type MOSFET) or a trench gate type IGBT.

A silicon substrate 12 has a first surface side doped with n-type impurity (first conductive type impurity) in which an island-shaped p type region 13 is formed. The silicon substrate 12 is n type entirely when the device is a MOSFET, and the silicon substrate 12 has a second side doped with p-type impurity opposing the first surface side. Incidentally, the island-shaped base region corresponds to a base region 13 which is shown entirely in a lateral direction in the figures. Moreover, n-type region 14 with high impurity concentration is formed in the island-shaped p-type region 13.

A trench 15 is formed in the silicon substrate 12 from the n-type region 14 so as to penetrate the p-type region 13. A shape of an opening portion of the trench in a plan view is substantially a rectangle with long sides and short sides in the present invention. A gate insulation film 16 is formed on an inner wall of the trench 15. A gate electrode 17 is formed in the trench so as to fill the trench 15. Current flowing between the n-type region 14 and the n-type silicon substrate 12 is controlled by a channel formed in the p-type region 13 by applying a voltage thereto through the gate insulation film 16 from the gate electrode 17.

Next, a manufacturing method of the semiconductor device 11 will be described. The silicon substrate 12 is prepared to have the first surface side doped with the n-type impurity as the first conductive type, the p-type region 13, and the n-type region 14 therein as described above. The n-type region 14 is formed so as to implant arsenic ion (As) at a dose of $8.0 \times 10^{14}$ cm$^{-2}$.

Figure 1A:
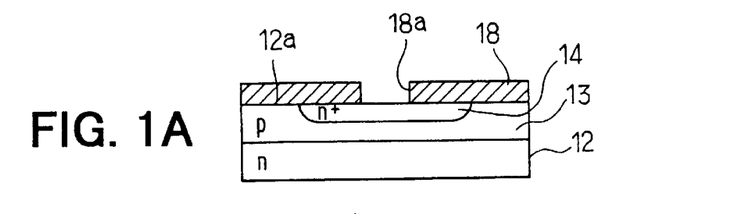
FIGS. 1A to 1F are schematic cross sectional views of a semiconductor substrate having a trench, showing manufacturing steps of a first embodiment of the present invention.
Figure 1B:
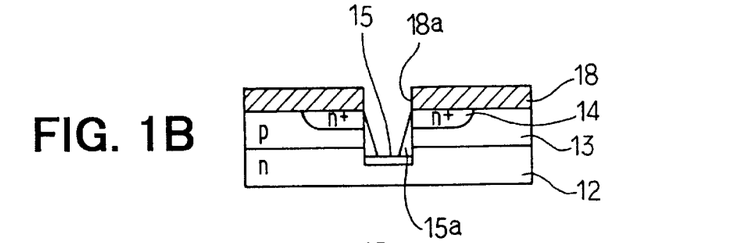

After that, a thick silicon oxide film 18 is formed on the silicon substrate 12 entirely as a mask member for forming the trench. Then, the thick silicon oxide film 18 is patterned by conducting photolithography and etching the thick silicon oxide film 18, so that an open 18a is formed (see FIG. 1A). After that, a region of the silicon substrate 12 exposed from the open 18a is removed away by anisotropic etching using the silicon oxide film 18 as the mask, whereby the trench 15 is formed to have a predetermined depth in the silicon substrate 12 (see FIG. 1B). The anisotropic etching for forming the trench is generally conducted by dry etching using etchant gases. This step is well known in the art.

Next, a wet process is performed. In other words, an inner surface of the trench 15 is etched by a mixed etching solution of hydrofluoric acid and nitric acid at a volume ratio in which HF:HNO$_3$ is equal to 1:100 (see FIG. 1C). By this etching, a damage layer 15a formed inside the trench 15 when the anisotropic etching step is performed is removed, and a shape of the trench 15 is improved (see FIG. 1D).

Figure 1C:
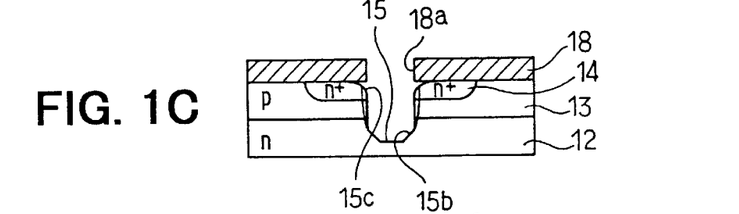

The trench 15 has inner sidewalls substantially perpendicular to a surface of the silicon substrate and to a bottom face of the trench 15 just after the anisotropic etching is performed. Then, the inner sidewalls of the trench 15 have inclined portions with respect to the surface of the silicon substrate 12 and the bottom face of the trench 15 by performing the wet process. In other words, a taper face 15b is formed on the inner sidewalls of the trench 15, between the inner sidewalls and the bottom face because the wet etching using the mixed solution described above has a face orientation dependency of an etching rate.

Edge portions of the trench 15 at an opening portion are rounded by using a characteristic of an impurity concentration dependency of the wet etching when the mixed solution is used. Namely, an etching rate is higher at a region having high impurity concentration, i.e., at the n-type region 14, and the etching rate decreases in accordance with decrease of an impurity concentration in a depth direction of the silicon substrate 12. An impurity concentration in the n-type region 14 decreases gradually in the depth direction, so that the etching rate changes gradually in accordance with the impurity profile in the depth direction. Therefore, the edge portion 15c of the trench 15 at the opening portion are rounded as shown in FIG. 1C.

Figure 1D:
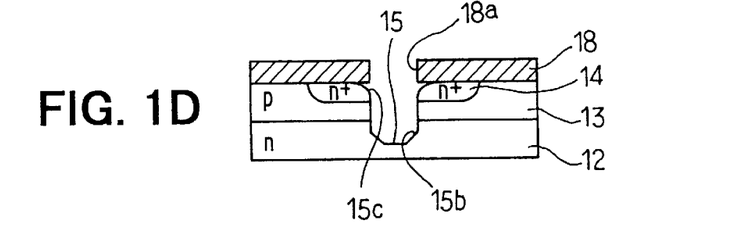
Figure 1E:
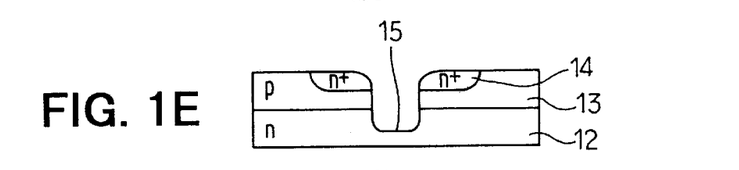
Figure 1F:
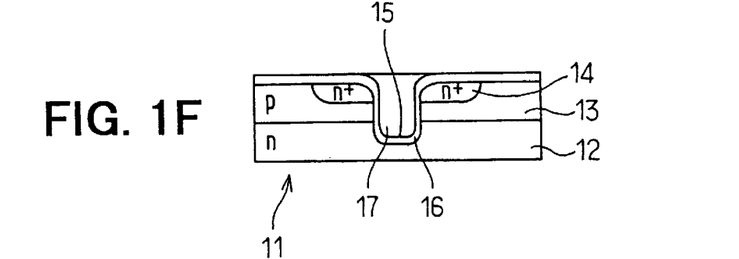

A short-time heat treatment is performed in a reduced hydrogen atmosphere of 80 Torr, at 1000° C. for 60 seconds so that crystallinity of the inner surface of the trench 15 is improved (see FIG. 1D). Subsequently, a thermal oxidation film is formed on the inner surface of the trench 15 by dry oxidation at 1150° C. as a sacrificial oxide film. The thermal oxidation film is removed when the oxide film 18 as the mask member is removed simultaneously in the following step as shown in FIG. 1E. The oxide film 18 and the sacrificial oxide film may not be removed simultaneously. The inner surface of the trench 15 is smoothed by the step for forming the sacrificial oxide film.

Then, the gate insulation film 16 is formed on the inner surface of the trench 15. The gate insulation film is composed of a well-known ONO (Oxide Nitride-Oxide) film. A silicon oxide film is formed to have a thickness of 20 nm by CVD method using TEOS (Tetra Ethyl Ortho-Silicate) as a raw material at first. Next, a thermal oxide film is formed to have a thickness of 15 nm, then, a silicon nitride film is formed to have a thickness of 30 nm. Thus, a lamination layer composed of the silicon oxide film having undergone a thermal oxidizing treatment and the silicon nitride film is formed on the inner surface of the trench 15 as the gate insulation layer 16. After that, the trench 15 is filled with a polycrystalline silicon including phosphorous to form the gate electrode 17.

Next, effects obtained by performing above-mentioned manufacturing method will be described based on a measured result.

Figure 2:
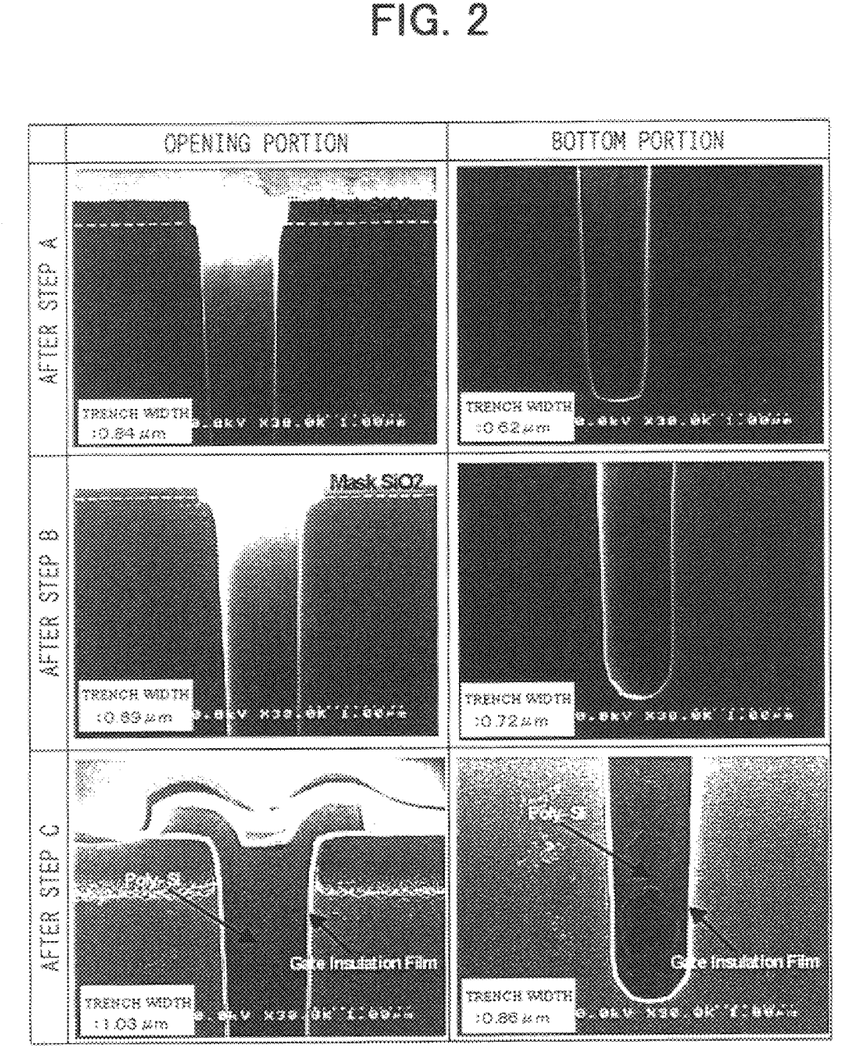
FIG. 2 is a table showing schematic cross sectional views of the trench formed through manufacturing steps of the first embodiment by TEM images.

FIG. 2 shows a table showing cross sectional TEM (Transmission Electron Microscope) images of the trench at the opening portion and at bottom portion thereof by SEM images. STEP A in the table corresponds to the step for forming the trench by anisotropic etching, STEP B in the table corresponds to the step for performing the wet process with the mixed solution of hydrofluoric acid and nitric acid, and performing the short-time heat treatment in the hydrogen atmosphere, and STEP C in the table corresponds to the step for filling the trench 15 with the polycrystalline silicon. Incidentally, scale in the images showing 1 m is correct. However, the magnification is an observing condition, and does not correspond to that of the image in the table.

As shown in FIG. 2, the bottom portion of the trench is modified to a polygonal shape because of the face orientation dependency of the etching rate by performing the wet process. In addition, the edge portions at the opening portion of the trench is rounded because the n-type region 14 is formed to have high impurity concentration, and the impurity concentration dependency of the etching rate in the mixed etching solution acts efficiently.

Moreover, the bottom portion of the trench is rounded so as to form the polygonal shape with adequate curvature by performing the sacrificial oxidizing treatment at high temperature. Similarly, the edge portions at the opening portion of the trench are rounded so as to form convexity with adequate curvature.

With regard to the removal of the damage layer caused by anisotropic etching for forming the trench, effects obtained by the removal of the damage layer will be explained from the point of view of an etching amount in the trench by the mixed solution described above, i.e., change of width of the trench.

As shown in FIG. 2, the width of the trench at both the opening portion and the bottom portion of the trench after the wet process (STEP B) is performed are larger than that immediately after the trench is formed by anisotropic etching. Moreover, an increasing amount of the width of the trench at the bottom portion where the damage layer may become thick is larger than that at the opening portion despite the same treatment performed in the STEP B. Accordingly, it can be considered that the damage layer produced by anisotropic etching to form the trench is removed from the trench by the wet process (STEP B) using the mixed solution of hydrofluoric acid and nitric acid.

Furthermore, when the lamination layer containing the silicon oxide film and the silicon nitride film is formed on the inner surface of the trench 15 as described above, an index defined by the following equation is improved. The index shows thickness uniformity of the insulation film formed not only in the trench entirely but also on a region on the surface of the silicon substrate 12 in the vicinity of the opening portion of the trench.

$$\text{Index }(\%)=(\text{Max}-\text{Min})/(2\times \text{AV})\times 100$$

wherein Max and Min are maximum and minimum thickness, respectively. AV is an average thickness. The index becomes 13.2% in this embodiment. The index is improved at a degree of about 6% in comparison with the index indicating 19.2% at a case when the insulation film is composed only of the thermal oxide film.

Figure 3:
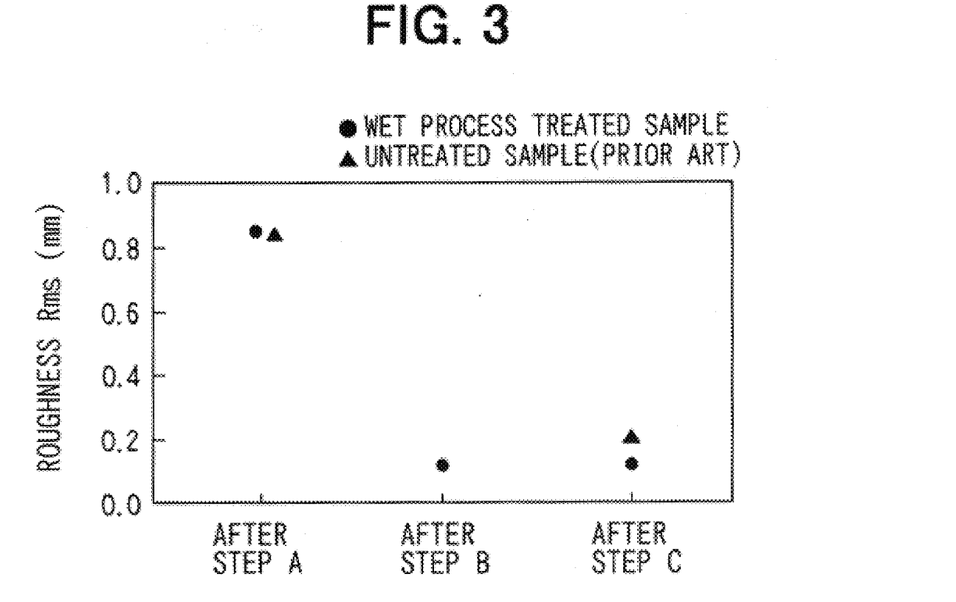
FIG. 3 is a graph showing surface surface roughness in the trench after the trench is formed, after a shape of the trench is improved, and after a thermal oxidation film is removed.

Next, a result will be explained, which is data showing surface surface roughness on the inner surface of the trench in each step measured by a AFM (Atomic Force Microscope). As shown in FIG. 3, surface roughness Rms just after the trench is formed by anisotropic etching is equal to 0.82 nm. The surface roughness Rms just after the wet process using the mixed solution described above is performed is equal to 0.12 nm, while the surface roughness Rms when the sacrificial oxidizing treatment is only performed, i.e., in the prior art is equal to 0.22 nm. In other words, the Rms is reduced to half of the prior art by performing the wet process in this embodiment.

Next, an effect will be explained, which is obtained by forming the insulation film on the inner surface of the trench 15 in a case that the inner surfaces along the long sides of the trench 15 are formed on (100) faces of the silicon substrate 12.

Shape at a corner of the bottom portion of the trench 15 influences to form a thermal oxidation film. Namely, the oxidation film formed at the corner tends to become thin in such a case that the sidewalls of the trench makes right angle with the bottom face of the trench like the prior art. Therefore, a concentration of an electric field is likely to occur at the corner of the trench, where the oxidation film is easily formed to be thin.

With regard to the problem described above, in this embodiment, the taper face 15b having a (113) face is exposed in the trench around the bottom face having a (110) face, so that the taper face 15b forms an obtuse angle with the bottom face. Moreover, a growth rate of the thermal oxidation film at the (113) face is larger than that at the (100) face, so that the thermal oxidation film at the corner of the trench is formed to be thick.

Figure 4:
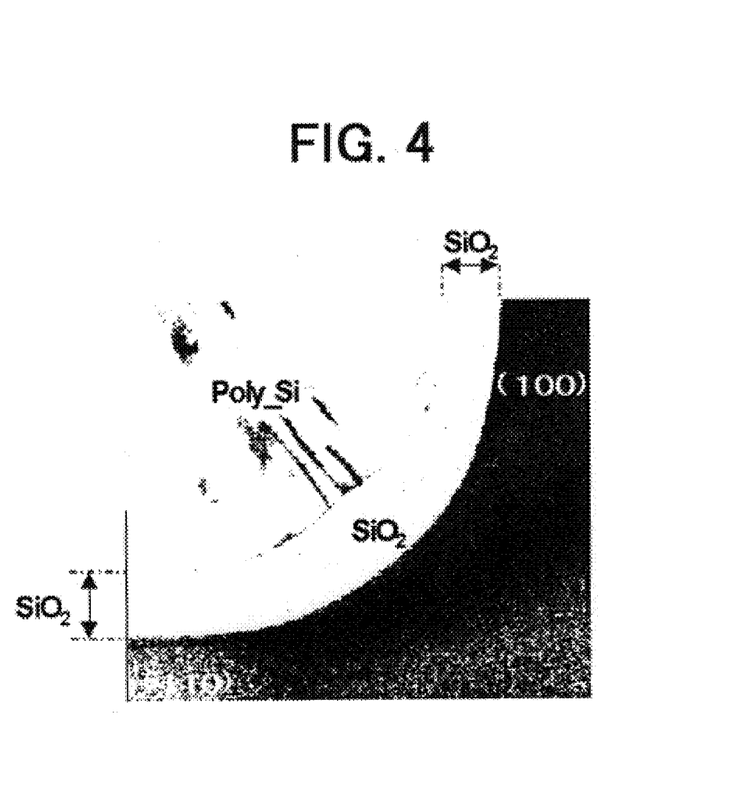
FIG. 4 is a schematic cross sectional view of a corner peripheral of the trench showing an oxide film formed thereon by a TEM image.

FIG. 4 shows a cross sectional TEM image of the corner of the trench. When a thickness of the oxidation film on the bottom face ((110) face orientation) is set to t1, a thickness of the oxidation film on the sidewall ((100) face orientation) is set to t2, and a thickness of the oxidation film on the taper face ((113) face orientation) is set to t3, a relationship among t1, t2, and t3 is as below, that can be understood from FIG. 4.

$$t3>t1>t2$$

Therefore, the oxidation films on the bottom face and the corner are prevented from being formed to be thin, whereby the semiconductor device can have a fine characteristic with respect to the gate insulation film.

According to this embodiment, the shapes at the bottom portion and the opening portion of the trench are improved so that the shapes are rounded adequately. Moreover, the damage layer caused by anisotropic etching for forming the trench is removed, and the inner surface of the trench is smoothed sufficiently. Thus, an improvement of a geometrical shape of the trench is achieved by the manufacturing method of this embodiment.

An effect obtained will be described, which is obtained by improving quality of the insulation film 16 which can be adapted to a gate insulation film of the semiconductor device. A valuation method will be described at first.

When a defect called a trap which causes deterioration of film quality occurs in the insulation film 16, an I-V (current-to-voltage) characteristics of a planar type MOS capacitor shows that current starts to flow at a low voltage in comparison with a case that the insulation film has no trap. That is because the trap assists tunneling phenomena in a case that a bias is applied to the MOS capacitor so as to be in an accumulation condition. After the current starts to flow, an electric field inside the insulation film is moderated since charge is captured by the trap in the insulation film, so that the I-V characteristics show a bump (kink) called the camel bump unlike the case that the insulation film has no trap as is well known.

Figure 5:
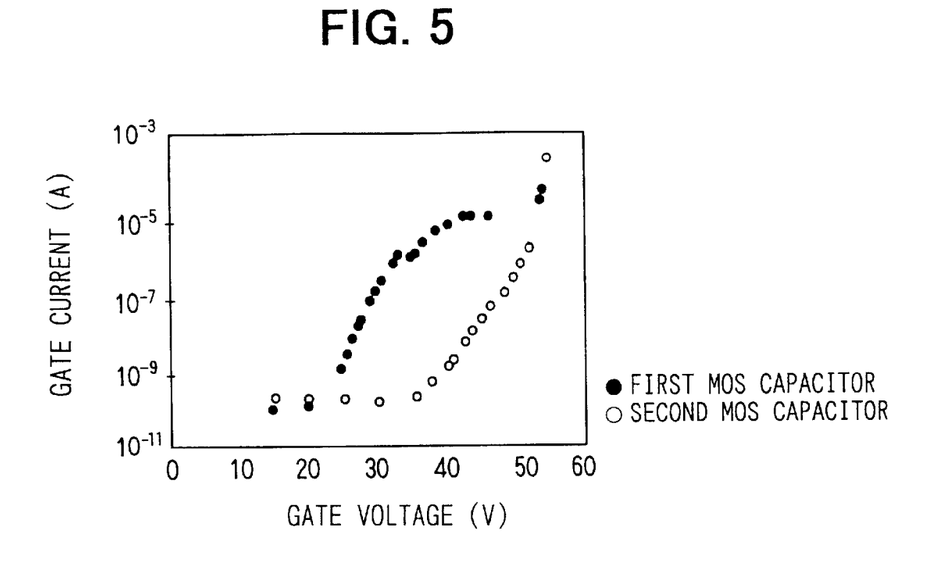
FIG. 5 is a graph showing a relationship between a gate voltage and a gate current of a sample untreated a wet process and a damage remaining sample.

To check the camel bump, a first MOS capacitor is formed on a surface of a semiconductor substrate with a thermal oxidation film as the insulation film 16. The semiconductor substrate has a damage layer intendedly formed on the surface thereof by performing anisotropic etching that is used to form the trench 15. Moreover, a second MOS capacitor is formed on a semiconductor substrate having no damage layer to be compared with the first MOS capacitor. FIG. 5 shows a measured result of I-V characteristics in both capacitors. As shown in FIG. 5, the I-V characteristics of the first MOS capacitor in which the damage layer remains shows the camel bump.

Figure 6:
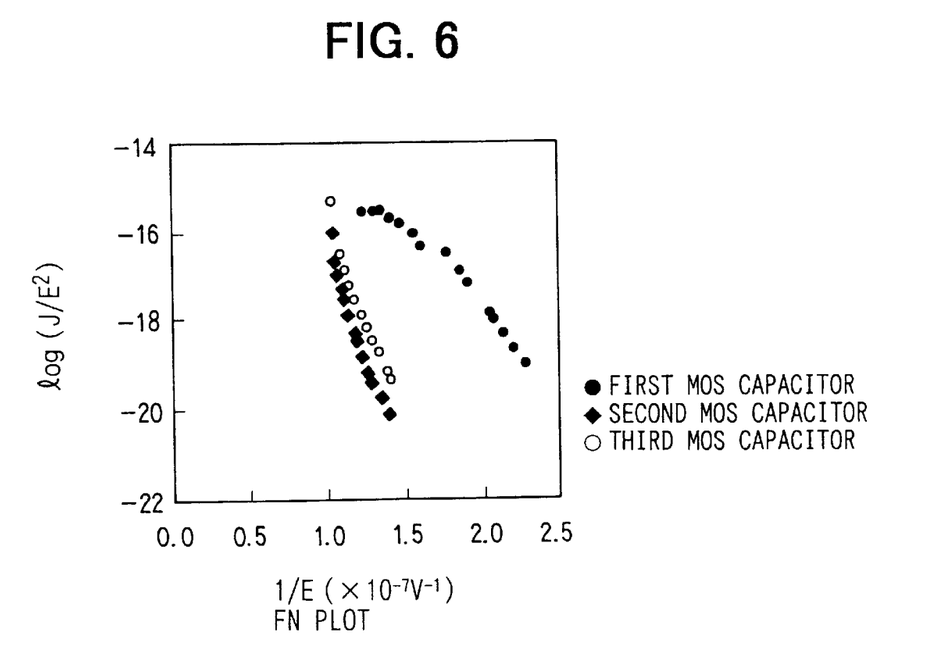
FIG. 6 is a graph showing a Fowler-Nordheim Plot of a damage-removed sample, a damage remaining sample, and the sample untreated wet process.

FIG. 6 shows the well-known FN plot (Fowler-Nordheim Plot) based on the I-V characteristics of the first MOS capacitor, the second MOS capacitor, and a third MOS capacitor in which a damage layer formed in a semiconductor substrate is removed so as to reduce an amount of a trap introduced in an oxidation film of the third MOS capacitor. As shown in FIG. 6, a gradient of the plot of the first MOS capacitor in which the damage layer remains is small in comparison with those of the other two MOS capacitors. Moreover, a gradient of the plot of the third MOS capacitor in which the damage layer is removed is close to that of the first MOS capacitor.

Figure 7:
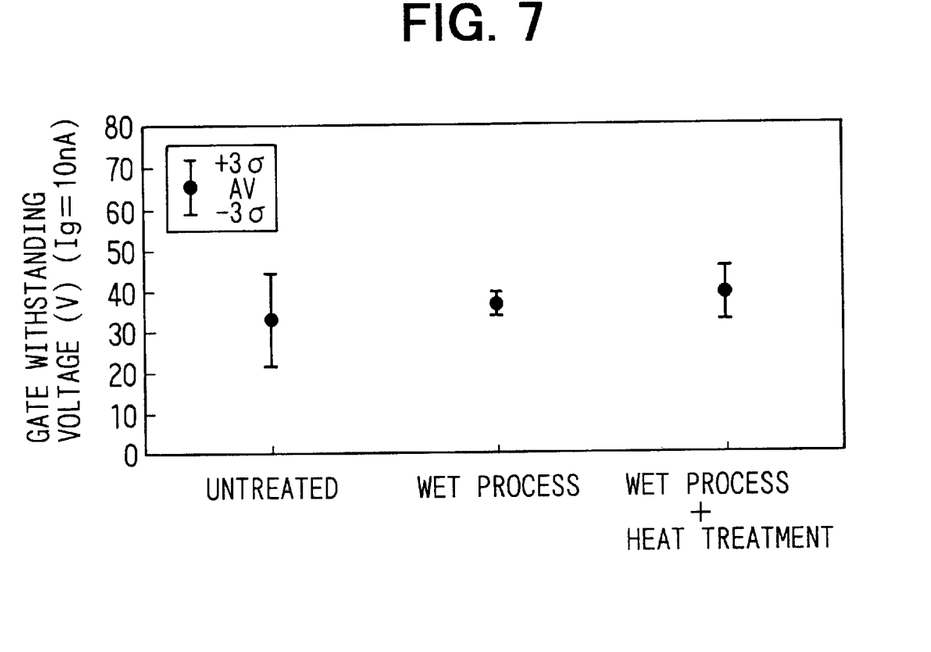
FIG. 7 is a graph showing a gate withstanding voltage of the sample untreated wet process, a sample treated wet process, and a sample performed a wet process and heat treatment.

In this embodiment, the following valuation method is defined based on the fact that deterioration of quality of an insulation film produced by the damaged layer formed in the semiconductor substrate influences the gradient of the FN plot of the predetermined MOS capacitor. Namely, a ratio of a gradient of the FN plot of a predetermined trench type MOS capacitor to a gradient of the FN plot of a planar MOS capacitor with a thermal oxidation film having high quality (referred to as a gradient ratio) is defined as an index for appraising quality of an insulation film formed in a trench. FIG. 7 is a result showing a gate withstanding voltage of trench type MOS capacitor improved by the manufacturing method in this embodiment as an effect of a film quality improvement of the insulation film 16 formed in the trench 15.

Three trench type MOS capacitors are appraised as shown in FIG. 7. The three MOS capacitors are formed using silicon substrates each having a first conductive type layer 14 formed by implantation of arsenic (As) ions at a dose of $8\times 10^{14} \text{cm}^{-2}$, and having a trench 15 formed by anisotropic etching. First one ("UNTREATED" in the figure) of the MOS capacitors dose not undergo a treatment in this embodiment, i.e., the wet process described above. Second one ("WET PROCESS" in the figure) of the MOS capacitors undergoes the wet process using the mixed solution with the volume ratio in which HF:HNO$_3$ is equal to 1:100. Remaining one ("WET PROCESS+HEAT TREATMENT" in the figure) of the MOS capacitors undergoes the wet process described just above and the short-time heat treatment conducted at 1000° C. in hydrogen atmosphere decompressed to 80 Torr for 60 seconds. Moreover, these three MOS capacitors are performed the following common steps. Namely, a sacrificial oxide layer is formed on an inner surface of a trench by dry oxidizing at 1150° C. Then, the sacrificial oxide layer is removed. After that, a thermal oxidation film is formed to have a thickness of 60 nm as a gate insulation film. Then, a gate electrode is formed by polycrystalline silicon including phosphorous. Furthermore, in a state that each of the three trench type MOS capacitors is biased so as to be in an accumulation condition in I-V characteristics, a gate voltage is defined as the gate withstanding voltage when an absolute value of a gate current Ig becomes 10 nA.

As shown in FIG. 7, an average of the gate withstanding voltage is improved by performing the wet process described above in comparison with the case that the wet process is not conducted. Similarly, fluctuation of the gate withstanding voltage is restrained. Moreover, an average of the gate withstanding of the capacitor to which the wet process and the heat treatment are performed is larger than that of the capacitor only performed the wet process.

Gradient ratios defined in described above are shown in FIG. 8. The gradient ratios show ratios of the above-mentioned three trench-type MOS capacitors to a planar MOS capacitor, and are obtained by the FN plot based on I-V characteristics of the three trench-type MOS capacitors and the planar MOS capacitor. The planar MOS capacitor has a thermal oxidation film having a thickness of 60 nm formed on a semiconductor substrate having a first type conductivity at low concentration.

Figure 8:
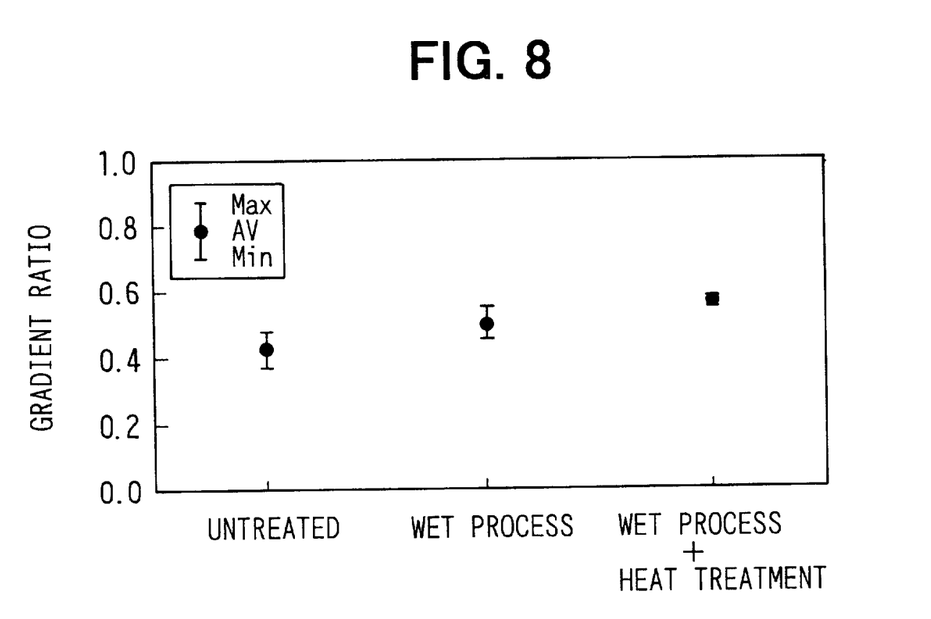
FIG. 8 is a graph showing gradient ratios of the wet process untreated sample, the sample untreated wet process, and the sample performed the wet process and the heat treatment.

The gradient ratios of the MOS capacitors to which the wet process described above is performed become larger than that of the MOS capacitor to which the wet process is not performed. Similarly, fluctuation of the gradient ratio is restrained. Moreover, the gradient ratio of the MOS capacitor to which the wet process and the heat treatment are performed is the largest among the three trench-type MOS capacitors. Namely, quality of the insulation film formed on the trench is improved by performing the wet process described above or by performing the short-time heat treatment in hydrogen atmosphere.

According to this embodiment, the following effects are obtained.

The wet process using the mixed solution of hydrofluoric acid and nitric acid is performed after the trench 15 is formed by anisotropic etching, so that the following effects are obtained by using the three characteristics of the mixed solution. First, the taper face can be formed around the bottom face of the trench by the face orientation dependency. Second, the edge portions at the opening portion of the trench 15 are rounded so as to form convexity with adequate curvature by the impurity concentration dependency. Third, the damage layer caused by anisotropic etching is removed by performing the wet process.

Moreover, the crystallinity of the inner surface of the trench 15 is improved by performing the short-time heat treatment in hydrogen atmosphere after the wet process described above is performed, whereby quality of the insulation film formed on the inner surface of the trench 15 is improved. Therefore, the semiconductor device can have improved fine electric characteristics.

Incidentally, the wet process is preferably performed at around room temperature for few minutes at most, and performed in a condition that the mixed solution is smooth (placid), that is, the mixed solution is not agitated so that the inner surface of the trench does not become rough.

Incidentally, the effects obtained by the wet process and the short-time heat treatment are appraised by the FN plot based on the I-V characteristics, so that the characteristics based on quality of the insulation film is appraised directly, which influences electrical characteristics of the semiconductor device.

Although the short-time heat treatment is conducted after the wet process using the mixed solution of hydrofluoric acid and nitric acid, the short-time heat treatment may be conducted just after anisotropic etching is performed. In this case, the same effect as described above is obtained by the short-time heat treatment.

Incidentally, the short-time heat treatment is preferably performed within 120 seconds.

(Second Embodiment)

Second embodiment of the present invention will now be described hereinafter with reference to FIGS. 9A to 12, and will be described on different features from the first embodiment mainly. Namely, in the second embodiment, a silicon substrate 21 is used instead of the silicon substrate 12, which does not have the island-shaped p-type region 13 and the n-type region 14 with high concentration. In other words, a manufacturing method shown in FIGS. 9A to 9F is substantially the same as that shown in FIGS. 1A to 1F. Consequently, the trench 15 formed through the steps shown in FIGS. 9A to 9F is adapted to an insulated isolation, for example. Incidentally, a solution used for improving a shape of the trench 15 is different from that of the first embodiment. The solution in this embodiment also includes hydrofluoric acid and nitric acid, but is diluted with pure water. The solution in this embodiment is referred to as a dilute mixed solution. Moreover, the dilute mixed solution has the same functions as the mixed solution in the first embodiment. That is, the dilute mixed solution has the face orientation dependency and the impurity concentration dependency of the etching rate of the silicon substrate.

Figure 9A:
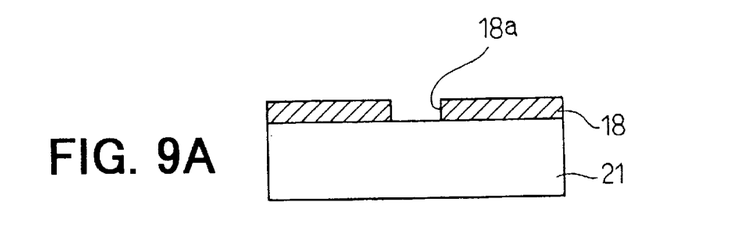
FIGS. 9A to 9F are schematic cross sectional views of a semiconductor substrate having a trench showing manufacturing steps of the second embodiment.
Figure 9B:
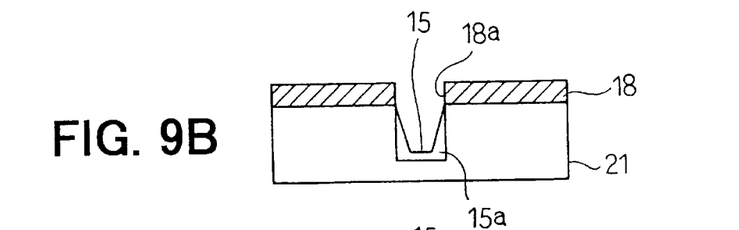
Figure 9C:
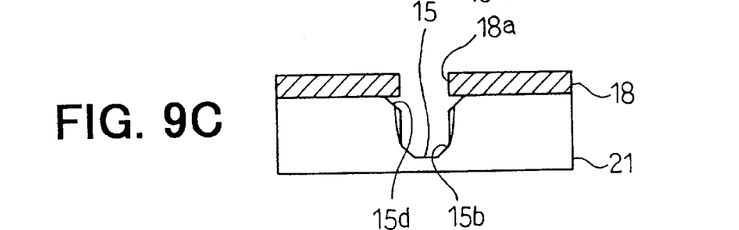
Figure 9D:
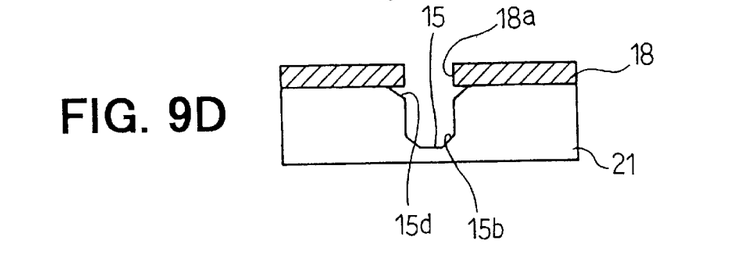
Figure 9E:
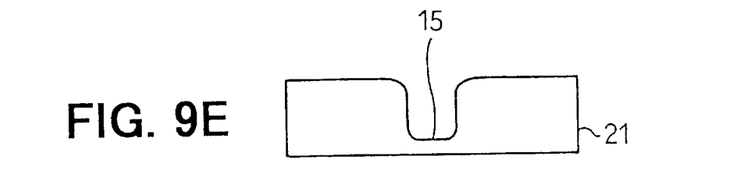
Figure 9F:
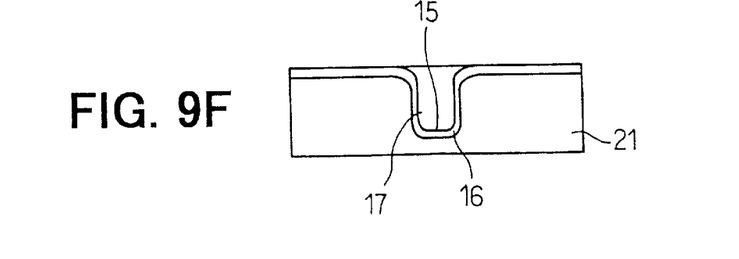

Although the manufacturing method shown in FIGS. 9A to 9F is substantially the same as that shown in FIGS. 1A to 1F of the first embodiment, a result after a wet process is conducted by using the dilute mixed solution in this embodiment is different from that obtained by performing the wet process in the first embodiment. Namely, the impurity concentration dependency does not work in the second embodiment. Therefore, edges at the opening portion of the trench 15 are not rounded to form convexity based on impurity concentration at a surface portion of a silicon substrate 21. However, the face orientation dependency of the diluted mixed solution is available, so that a taper face 15d is formed at an opening portion of the trench as shown in FIG. 9C.

Figure 10:
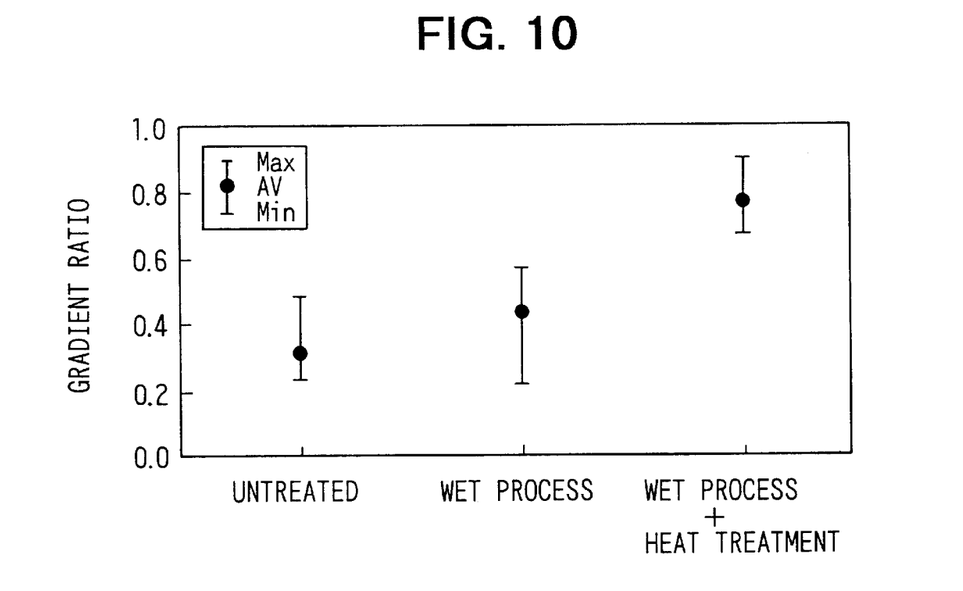
FIG. 10 is a graph showing gradient ratios of a sample untreated a wet process, a sample treated a wet process, and a sample performed the wet process and heat treatment.

Moreover, the dilute mixed solution is diluted with pure water to have a volume ratio in which HF:HNO$_3$:H$_2$O is 1:150:150. Through the steps described above, three trench-type MOS capacitors each having a gate oxidation film with a thickness of 60 nm are formed, which are similar to the three trench-type MOS capacitors in the first embodiment. The gradient ratios of the three trench-type MOS capacitors in the second embodiment are shown in FIG. 10 similarly to the first embodiment.

Similar to the case of first embodiment shown in FIG. 8, even if the n-type region (first conductive type layer) is not formed on the opening portion of the trench 15, and even if a mixed solution of hydrofluoric acid and nitric acid is diluted with pure water, the gradient ratio is improved by performing the wet process using the dilute mixed solution. Especially, the gradient ratio is greatly improved by performing the short-time heat treatment in addition to the wet process, and fluctuation of the gradient ratio is restrained.

Consequently, according to the second embodiment, even if the n-type region with high impurity concentration is not formed in the semiconductor substrate, quality of the insulation film formed on the inner surface of the trench can be improved. Moreover, even if the mixed solution of hydrofluoric acid and nitric acid is diluted with pure water, the quality of the insulation film formed on the inner surface of the trench can be also improved.

Next, an effect will be described, which is obtained by performing the wet process using the mixed solution of hydrofluoric acid and nitric acid, in which a volume ratio of $HF:HNO_3$ is 1:100.

Figure 11:
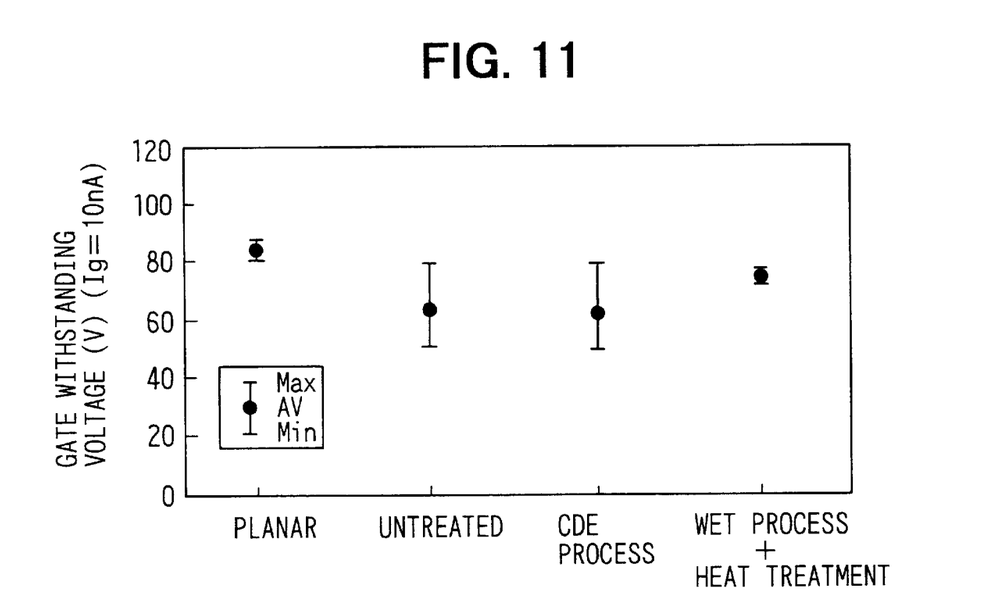
FIG. 11 is a graph showing a gate withstanding voltage of a planar MOS capacitor, the sample untreated the wet process, a sample treated CDE, and the sample treated wet process.

FIG. 11 shows gate withstanding voltages of three trench-type MOS capacitors and a planar MOS capacitor ("PLANAR" in the figure) for a reference. The gate withstanding voltages are defined similar to those of the first embodiment as shown in FIG. 7. First one of the three trench-type MOS capacitors has a trench to which the wet process is not performed ("UNTREATED" in the figure). Second one of the three trench-type MOS capacitors has a trench to which a CDE process, by which an etching amount in the trench becomes 100 nm, is performed as shown in FIG. 14 as the other prior art ("CDE PROCESS" in the figure). Remaining one of the three trench-type MOS capacitors has a trench to which the short-time heat treatment is performed at 1000° C. in depressurized hydrogen atmosphere at 80 Torr for 60 seconds after the wet process using the dilute mixed solution is performed ("WET+HEAT TREATMENT" in the figure). Incidentally, the remaining one described above is referred to as a trench-type MOS capacitor of the second embodiment.

Moreover, each of the trenches of the three trench-type MOS capacitors is performed the following steps. A sacrificial oxidation process is conducted by oxidizing at 1150° C. in dry atmosphere. After that, a CVD oxide film is formed to have a thickness of 20 nm by using a TEOS as a raw material. Next, a thermal oxidizing process is performed so that a total thickness of an oxide film becomes 340 nm. Then, a silicon nitride film is formed on the oxide film to have a thickness of 30 nm by low-pressure CVD, and then, thermal oxidizing treatment is conducted so that an ONO film is formed as a gate insulation film.

Furthermore, the planar MOS capacitor has the same ONO film as the three trench-type MOS capacitors described above as a gate insulation film. As shown in FIG. 11, the gate withstanding voltage of the trench-type MOS capacitor of the second embodiment is improved as well as fluctuation of the gate withstanding voltage in comparison with that of the trench-type MOS capacitor having the trench performed the CDE process. Moreover, the gate withstanding voltage of the trench-type MOS capacitor of the second embodiment is close to that of the planar MOS capacitor.

Figure 12:
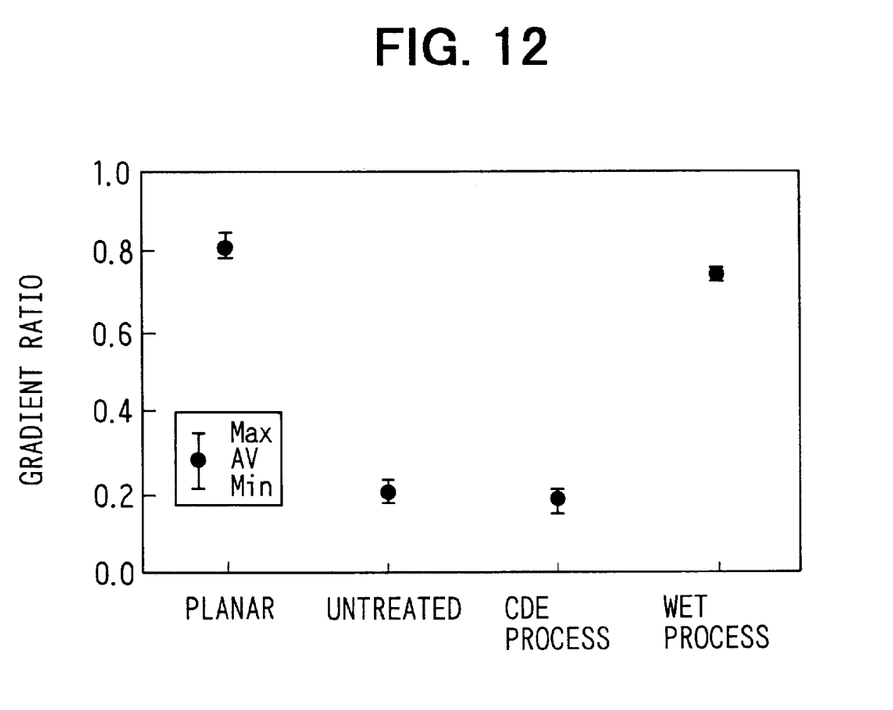
FIGS. 12 is the graph showing a gate withstanding voltage of the planar MOS capacitor, the sample untreated the wet process, a sample treated CDE, and the sample treated wet process.

FIG. 12 shows gradient ratios based on the FN plot (not shown) of the planar MOS capacitor and the three trench-type MOS capacitors described above. As shown in FIG. 12, the gradient ratio of the trench-type MOS capacitor of the second embodiment is greatly improved in comparison with that of the trench-type MOS capacitor having the trench to which the CDE process is performed. Moreover, the gradient ratio of the trench-type MOS capacitor of the second embodiment is close to that of the planar MOS capacitor.

Accordingly, the insulation film formed in the trench as the gate insulation film by the manufacturing method in the present invention has substantially the same quality as a planar-type semiconductor device.

With regard to the improvement of the opening portion of the trench 15, unlike the first embodiment, the n-type region with high concentration is not formed in the second embodiment. Therefore, it is difficult to form an adequate rounded convex shape on the edge at the opening portion of the trench. However, a polygonal shape exposing the taper face is formed on the edge by the face orientation dependency of the dilute mixed solution. Further, in this case, the shape of the edge at the opening portion of the trench is improved to form the rounded convex shape by performing the sacrificial oxidizing treatment at high temperature.

According to the second embodiment, even if the n-type region with high concentration is not formed at the opening portion of the trench 15, the shape of the trench is improved sufficiently, and the damaged layer in the trench 15 is removed sufficiently. Thus, electrical characteristics of the semiconductor device having the trench 15 formed by the method described in the second embodiment are fine.

(Other embodiment)

Although the short-time heat treatment is conducted in addition to the wet process in the first and second embodiments, the effects described in the above-mentioned embodiments are sufficiently obtained by only performing the wet process in comparison with the prior art.

Moreover, although the ONO film is formed as the gate insulation film of the MOSFET or the IGBT as the semiconductor device in the above-mentioned embodiments, a thermal oxidation film may only compose the gate insulation film. In this case, similarly to the case that ONO film is formed, the effects described above are sufficiently obtained in comparison with the prior art.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A manufacturing method of a semiconductor device comprising:

depositing a mask member for forming a trench on a semiconductor substrate;

patterning the mask member to form an opening portion therein;

forming the trench in a depth direction of the semiconductor substrate by anisotropic etching through the opening portion;

removing a polymer formed by the anisotropic etching from the trench;

modifying a shape of the trench through a wet process using a mixed solution containing hydrofluoric acid and nitric acid so that a damaged layer in the trench formed by the anisotropic etching is removed;

forming a thermal oxidation film on an inner surface of the trench by a thermal oxidizing treatment;

removing the thermal oxidation film;

removing the mask member from the semiconductor substrate; and forming an insulation film inside the trench.

2. A manufacturing method of a semiconductor device according to claim 1, wherein a volume ratio of the hydrofluoric acid with respect to the nitric acid in the mixed solution is in a range of 1:50 to 1:300.

3. A manufacturing method of a semiconductor device according to claim 1, further comprising:
performing heat treatment after the wet process using the mixed solution containing hydrofluoric acid and nitric acid.

4. A manufacturing method of a semiconductor device according to claim 1, wherein the removing the thermal oxidation film and the removing the mask member are performed simultaneously.

5. A manufacturing method of a semiconductor device according to claim 1, further comprising setting a temperature in the thermal oxidizing treatment to at least 1100° C.

6. A manufacturing method of a semiconductor device according to claim 1, further comprising:
forming another thermal oxidation film on the inner surface of the trench by another thermal oxidizing treatment after the removing of the mask member, wherein
the forming of the insulation film performed after the another oxidation film is removed.

7. A manufacturing method of a semiconductor device according to claim 1, wherein the forming of the trench creates an opening portion thereof having a long side.

8. A manufacturing method of a semiconductor device according to claim 1, wherein the semiconductor substrate has a surface having a (110) face orientation, a variation of which is in a range of ±3°, and the forming of the trench is performed so that an extending direction of the trench is in a range of ±3° with respect to a (100) face.

9. A manufacturing method of a semiconductor device according to claim 1, wherein the insulation film is an oxide film composed of a lamination layer having an oxide layer formed by low-pressure CVD using TEOS as a raw material and a thermal oxidation layer formed by thermal oxidizing,
wherein the oxide layer formed by low-pressure CVD is densified by thermal oxidation, and the thermal oxidation layer is formed on an interface between the oxide layer formed by low-pressure CVD and the inner surface of the trench.

10. A manufacturing method of a semiconductor device according to claim 2, wherein the mixed solution is diluted with pure water.

11. A manufacturing method of a semiconductor device according to claim 3, further comprising performing the heat treatment at 800° C. in hydrogen atmosphere for less than five minutes.

12. A manufacturing method of a semiconductor device according to claim 6, wherein the forming of another thermal oxidation film is performed in an atmosphere containing water vapor.

13. A manufacturing method of a semiconductor device according to claim 8, wherein the surface of the semiconductor substrate is inclined with respect to the (110) face orientation, and an inclined direction of the surface with respect to the (110) face orientation is in parallel with a long side of the trench.

14. A manufacturing method of a semiconductor device according to claim 1, wherein the insulation film is an oxide film composed of a lamination layer having an oxide layer formed by low-pressure CVD using TEOS as a raw material.

15. A manufacturing method of a semiconductor device according to claim 11, further comprising performing the heat treatment in a depressurized atmosphere.

16. A manufacturing method of a semiconductor device comprising:
preparing a semiconductor substrate having a surface portion of a first conductivity type formed thereon;
forming a second conductive type region in the surface portion;
forming a first conductive type region in the second conductive region, the first conductive type region having an impurity concentration higher than that of the semiconductor substrate;
depositing a mask member for forming a trench on the surface portion of the semiconductor substrate;
patterning the mask member to form an opening portion therein;
forming the trench at a region in a depth direction of the semiconductor substrate by anisotropic etching through the opening portion;
removing a polymer formed by the anisotropic etching from the trench;
modifying a shape of the trench thorough a wet process using a mixed solution containing hydrofluoric acid and nitric acid so that a damaged layer formed by the anisotropic etching is removed;
forming a thermal oxidation film on an inner surface of the trench by thermal oxidizing treatment;
removing the thermal oxidation film;
removing the mask member from the semiconductor substrate;
forming an insulation film inside the trench; and
filling the trench with a polycrystalline silicon through the insulation film.

17. A manufacturing method of a semiconductor device according to claim 16, further comprising forming the first conductive type region by implanting arsenic ions into the second conductive type region at a dose of $8 \times 10^{14}$ atoms/cm$^2$ or less.

18. A manufacturing method of a semiconductor device according to claim 16, wherein a volume ratio of the hydrofluoric acid with respect to the nitric acid in the mixed solution is in a range of 1:50 to 1:300.

19. A manufacturing method of a semiconductor device according to claim 16, further comprising:
forming a high impurity concentration region at a surface portion of the region where the trench is to be formed so that an impurity concentration decreases gradually in a depth direction of the semiconductor substrate, before the trench is formed; and
conducting etching depending on the impurity concentration in the wet process.

20. A manufacturing method of a semiconductor device according to claim 16, further comprising:
performing heat treatment after the wet process using the mixed solution containing hydrofluoric acid and nitric acid.

21. A manufacturing method of a semiconductor device according to claim 16, wherein temperature in the thermal oxidizing treatment is set to at least 1100° C.

22. A manufacturing method of a semiconductor device according to claim 16, wherein the insulation film is an oxide film composed of a lamination layer having an oxide layer formed by low-pressure CVD using TEOS as a raw material and a thermal oxidation layer formed by thermal oxidizing,
wherein the oxide layer formed by low-pressure CVD is densified by thermal oxidation, and the thermal oxidation layer is formed on an interface between the oxide layer formed by low-pressure CVD and the inner surface of the trench.

23. A manufacturing method of a semiconductor device according to claim 16, wherein the forming of the trench comprises forming the trench so that an opening portion thereof has a long side.

24. A manufacturing method of a semiconductor device according to claim 16, wherein the semiconductor substrate has a surface having a (110) face orientation, a variation of which is in a range of ±3°, and the trench is formed so that an extending direction of the trench is in a range of ±3° with respect to a (100) face.

25. A manufacturing method of a semiconductor device according to claim 18, wherein the mixed solution is diluted with pure water.

26. A manufacturing method of a semiconductor device according to claim 20, wherein the performing of the heat treatment is done at 800° C. in hydrogen atmosphere for less than five minutes.

27. A manufacturing method of a semiconductor device according to claim 16, wherein the oxide layer including the insulation film is formed by low-pressure CVD using TEOS as a raw material.

28. A manufacturing method of a semiconductor device according to claim 24, wherein the surface of the semiconductor substrate is inclined with respect to the (110) face orientation, and an inclined direction of the surface with respect to the (110) face orientation is in parallel with a long side of the trench.

29. A manufacturing method of a semiconductor device according to claim 26, wherein the performing of the heat treatment is done in a depressurized atmosphere.

* * * * *